United States Patent
McCormick et al.

(10) Patent No.: US 7,156,942 B2
(45) Date of Patent: Jan. 2, 2007

(54) ORGANIC ELECTROLUMINESCENT DEVICE AND ENCAPSULATION METHOD

(75) Inventors: Fred B. McCormick, Maplewood, MN (US); Jon E. Ottman, Eagan, MN (US); Raghunath Padiyath, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/179,401

(22) Filed: Jul. 12, 2005

(65) Prior Publication Data

US 2005/0247400 A1    Nov. 10, 2005

Related U.S. Application Data

(62) Division of application No. 10/324,585, filed on Dec. 19, 2002, now Pat. No. 6,975,067.

(51) Int. Cl.
*B32B 38/04* (2006.01)
*H01J 1/62* (2006.01)

(52) U.S. Cl. .................. 156/249; 313/506; 445/24; 430/201; 257/40

(58) Field of Classification Search ............. 313/506; 445/24; 257/40; 430/201; 156/249
See application file for complete search history.

(56) References Cited

U.S. PATENT DOCUMENTS

| | | | |
|---|---|---|---|
| 4,701,236 A * | 10/1987 | Vieilledent | 156/252 |
| 5,247,190 A | 9/1993 | Friend et al. | |
| 5,408,109 A | 4/1995 | Heeger et al. | |
| 5,530,581 A | 6/1996 | Cogan | |
| 5,621,131 A | 4/1997 | Kreuder et al. | |
| 5,681,666 A | 10/1997 | Treger et al. | |
| 5,693,446 A | 12/1997 | Staral et al. | |
| 5,695,907 A | 12/1997 | Chang | |
| 5,708,130 A | 1/1998 | Woo et al. | |
| 5,710,097 A | 1/1998 | Staral et al. | |
| 5,721,160 A | 2/1998 | Forrest et al. | |
| 5,725,909 A | 3/1998 | Shaw et al. | |
| 5,725,989 A | 3/1998 | Chang et al. | |
| 5,728,801 A | 3/1998 | Wu et al. | |
| 5,840,217 A | 11/1998 | Lupo et al. | |
| 5,869,350 A | 2/1999 | Heeger et al. | |
| 5,900,327 A | 5/1999 | Pei et al. | |
| 5,929,194 A | 7/1999 | Woo et al. | |
| 5,998,085 A | 12/1999 | Isberg et al. | |
| 6,004,660 A | 12/1999 | Toplski et al. | |

(Continued)

FOREIGN PATENT DOCUMENTS

EP    0 734 082    9/1996

(Continued)

OTHER PUBLICATIONS

Friend et al.; "Electroluminescence in conjugated polymers" Nature; vol. 397; Jan. 1999 pp. 121-128.

(Continued)

*Primary Examiner*—Melvin Mayes
*Assistant Examiner*—Kim McClelland
(74) *Attorney, Agent, or Firm*—Jean A. Lown; Brian C. Whipps

(57) ABSTRACT

Organic electroluminescent devices and methods of preparing such devices are provided. The organic electroluminescent devices include a first electrode, a light emitting structure, a second electrode, a conductive layer, and a non-conductive material. The light emitting structure is disposed between the first and second electrodes. The conductive layer is disposed on at least a portion of the second electrode and is in electrical communication with the second electrode through an opening in the non-conductive material.

19 Claims, 6 Drawing Sheets

U.S. PATENT DOCUMENTS

| | | | |
|---|---|---|---|
| 6,030,715 | A | 2/2000 | Thompson et al. |
| 6,114,088 | A | 9/2000 | Wolk et al. |
| 6,132,641 | A | 10/2000 | Rietz et al. |
| 6,150,043 | A | 11/2000 | Thompson et al. |
| 6,169,163 | B1 | 1/2001 | Woo et al. |
| 6,194,119 | B1 | 2/2001 | Wolk et al. |
| 6,214,520 | B1 | 4/2001 | Wolk et al. |
| 6,221,543 | B1 | 4/2001 | Guehler et al. |
| 6,221,553 | B1 | 4/2001 | Wolk et al. |
| 6,228,543 | B1 | 5/2001 | Mizuno et al. |
| 6,228,555 | B1 | 5/2001 | Hoffend, Jr. et al. |
| 6,231,939 | B1 | 5/2001 | Shaw et al. |
| 6,242,115 | B1 | 6/2001 | Thomson et al. |
| 6,242,152 | B1 | 6/2001 | Staral et al. |
| 6,268,695 | B1 | 7/2001 | Affinito |
| 6,284,425 | B1 | 9/2001 | Staral et al. |
| 6,291,116 | B1 | 9/2001 | Wolk et al. |
| 6,358,664 | B1 | 3/2002 | Nirmal et al. |
| 6,413,645 | B1 | 7/2002 | Graff et al. |
| 6,482,564 | B1 | 11/2002 | Nirmal et al. |
| 6,485,884 | B1 | 11/2002 | Wolk et al. |
| 6,521,324 | B1 | 2/2003 | Debe et al. |
| 6,621,213 | B1 * | 9/2003 | Kawashima ............... 313/506 |
| 6,672,921 | B1 * | 1/2004 | Liang et al. ............... 445/24 |
| 2001/0049030 | A1 | 12/2001 | Okada et al. |
| 2002/0079832 | A1 | 6/2002 | Van Tongeren et al. |
| 2002/0158574 | A1 | 10/2002 | Wolk et al. |
| 2002/0182544 | A1 * | 12/2002 | Chan-Park et al. ......... 430/311 |
| 2002/0196401 | A1 * | 12/2002 | Grace et al. ............... 349/158 |

FOREIGN PATENT DOCUMENTS

| | | |
|---|---|---|
| JP | 2000-195673 | 7/2000 |
| WO | WO 98/55561 | 12/1998 |
| WO | WO 99/40655 | 8/1999 |
| WO | WO 00/18851 | 4/2000 |
| WO | WO 00/26973 | 5/2000 |
| WO | WO 00/36665 | 6/2000 |
| WO | WO 00/70655 | 11/2000 |
| WO | WO 01/81649 | 11/2001 |
| WO | WO 02/05361 | 1/2002 |

OTHER PUBLICATIONS

Kraft et al.; "Electroluminescent Conjugated Polymers—Seeing Polymers in a New Light"; Angew. Chem. Int. Ed. 1998 pp. 402-428.

Chen et al.; "Recent Developments in Molecular Organic Electroluminescent Materials"; Macromol. Symp. 125 (1997) pp. 1-48.

Fujikawa et al.; "Energy structures of triphenylamine oligomers"; Synthetic Metals; 91 (1997) pp. 161-162.

Grazulevicius et al.; "Charge-Transporting Polymers and Molecular Glasses"; Handbook of Advanced Electronic and Photonic Materials and Devices; vol. 10; 2001 pp. 233-274.

Graff et al.; "Fabrication of OLED Devices on Engineered Plastic Substrates"; 2000 Society of Vacuum Coaters ; 2000; pp. 397-400.

Mahon et al.; "Requirements of Flexible Substrates for Organic Light Emitting Devices in Flat Panel Display Applications"; 1999 Society of Vacuum Coaters; 42nd Annual Technical Conference Proceedings (1999) pp. 456-459.

Affinito et al.; "A new method for fabricating transparent barrier layers"; Thin Solid Films 290-291 (1996) pp. 63-67.

Affinito et al. "PML/oxide/PML barrier layer performance differences arising from use of UV or electron beam polymerization of the PML layers"; Thin Solid Films 308-309 (1997) pp. 19-25.

Affinito et al.; "Polymer-Oxide Transparent Barrier Layers"; 1996 Society of Vacuum Coaters; 39th Annual Technical Conference Proceedings (1996) pp. 392-397.

"*Hybrid Design For Organic Electroluminescent Devices*", IBM Technical Disclosure Bulletin, IBM Corp., New York, vol. 40, No. 9, pp. 115-116, Sep. 1, 1997.

* cited by examiner

ORGANIC ELECTROLUMINESCENT DEVICE AND ENCAPSULATION METHOD

CROSS REFERENCE TO RELATED APPLICATIONS

This application is a divisional of U.S. Ser. No. 10/324,585, filed Dec. 19, 2002, now U.S. Pat. No. 6,975,067, the disclosure of which is herein incorporated by reference.

FIELD OF THE INVENTION

The invention relates to organic electroluminescent devices and methods of preparing organic electroluminescent devices. In particular, organic electroluminescent devices are provided that include a conducting layer such as a deformable foil in electrical communication with one of the electrodes.

BACKGROUND OF THE INVENTION

Organic electroluminescent devices typically include an organic electroluminescent material disposed between an anode and cathode. The devices can contain electrode materials or electroluminescent materials that are reactive with oxygen or moisture. Organic electroluminescent devices that contain reactive materials are usually encapsulated to extend the useful lifetimes of the devices. Encapsulation methods typically involve positioning and sealing the electrodes and electroluminescent material between two substrates such as glass and polymeric materials or between a substrate and a metal can. Various other protective layers can also be included to further reduce contact of the reactive materials with oxygen and water.

Organic electroluminescent devices are useful, for example, in a variety of lighting applications and in the preparation of high and low resolution displays.

SUMMARY OF THE INVENTION

Generally, the present invention relates to organic electroluminescent devices and methods of preparing such devices.

One aspect of the invention provides an organic electroluminescent device that includes a first electrode, a second electrode, a light emitting structure disposed between the first and second electrode, a conductive layer disposed over at least a portion of the second electrode, and a non-conductive material defining an opening through which the conductive layer is in electrical communication with the second electrode.

Another aspect of the invention provides a method of preparing an organic electroluminescent device. An electroluminescent structure is formed that includes a first electrode, a second electrode, and a light emitting structure disposed between the first and second electrodes. An opening is formed in a non-conductive material and aligned with a surface of the second electrode. Electrical communication is established between a conductive layer and the second electrode through the opening in the non-conductive material. The method can be a roll-to-roll process.

The above summary of the present invention is not intended to describe each disclosed embodiment or every implementation of the present invention. The Figures and the detailed description that follow more particularly exemplify these embodiments.

BRIEF DESCRIPTION OF THE DRAWINGS

The invention can be more completely understood in consideration of the following detailed description of various embodiments of the invention in connection with the accompanying drawings, in which:

FIG. 12B includes a non-conductive material between the pair of electrodes.

Figure 1:
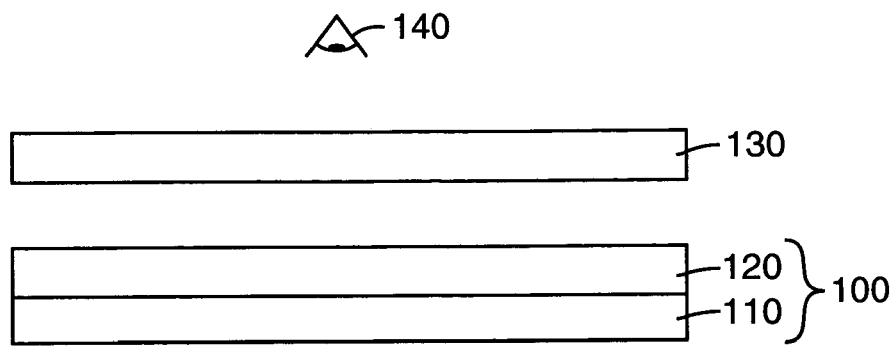
FIG. 1 is a schematic cross-sectional view of an organic electroluminescent display construction.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE INVENTION

Organic electroluminescent devices and methods of preparing such devices are provided. In particular, organic electroluminescent devices are provided that include a conductive layer in electrical communication with one of the electrodes through an opening in a non-conductive material. Organic electroluminescent devices can be used, for example, as backlights, low resolution displays, high resolution displays, and the like.

As used herein, "organic electroluminescent device" or "OEL device" refers to an article that includes a layer, or layers, of at least one organic electroluminescent material disposed between a first electrode and a second electrode. Typically, at least one of the electrodes can transmit light emitted by the organic electroluminescent material. As used herein, "organic electroluminescent display" or "OEL display" refers to an article that includes one or more organic electroluminescent devices.

R. H. Friend et al. in "Electroluminescence in Conjugated Polymers," Nature, 397, p. 121 (1999), incorporated herein by reference, describe one mechanism of the operation of organic electroluminescent devices. Electrons are injected into the organic electroluminescent material(s) from a cathode and holes are injected into the organic electroluminescent material(s) from an anode. As the injected charges migrate towards the oppositely charged electrode, they can recombine to form electron-hole pairs that are typically referred to as excitons. These excitons, or excited state species, can emit energy in the form of light as they decay back to a ground state. The region of the device in which the excitons are generally formed can be referred to as the recombination zone.

FIG. 1 shows a schematic cross-sectional view of one example of an organic electroluminescent device or display 100. The structure includes a device layer 110 and an optional substrate 120. Any other suitable display component can also be included with the device or display 100. Additional optional elements or devices 130 suitable for use with electronic displays or devices can be provided between the OEL device or display 100 and viewer position 140.

The device layer 110 includes one or more OEL devices that emit light through the optional substrate 120 toward a viewer position 140. The viewer position is used generically to indicate an intended destination for the emitted light whether it be an actual human observer, a screen, an optical component, an electronic device, or the like.

Device layer 110 can include one or more OEL devices arranged in any suitable manner. For example, in lamp applications (e.g., backlights for liquid crystal display (LCD) modules), device layer 110 can constitute a single OEL device that spans an entire intended backlight area. Alternatively, in other lamp applications, device layer 110 can constitute a plurality of closely spaced devices that can be contemporaneously activated. For example, relatively small and closely spaced red, green, and blue light emitters can be patterned between common electrodes so that device layer appears to emit white light when the emitters are activated. Other arrangements for backlight applications are also contemplated.

In some applications, the device layer 110 can include a plurality of independently addressable OEL devices that emit the same or different colors. Each device can represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indication applications).

The optional element 130 can be any element or combination of elements suitable for use with an OEL device or display 100. For example, the optional element can include a liquid crystal display module when device or display 100 is a backlight. One or more polarizers or other elements, such as an absorbing or reflective clean-up polarizer, can be provided between the liquid crystal module and the backlight device or display 100. Alternatively, when device or display 100 is an information display, optional element 130 can include one or more polarizers, wave plates, touch panels, antireflective coatings, anti-smudge coatings, projection screens, brightness enhancement films, or other optical components, coatings, user interface devices, or the like.

Figure 2:
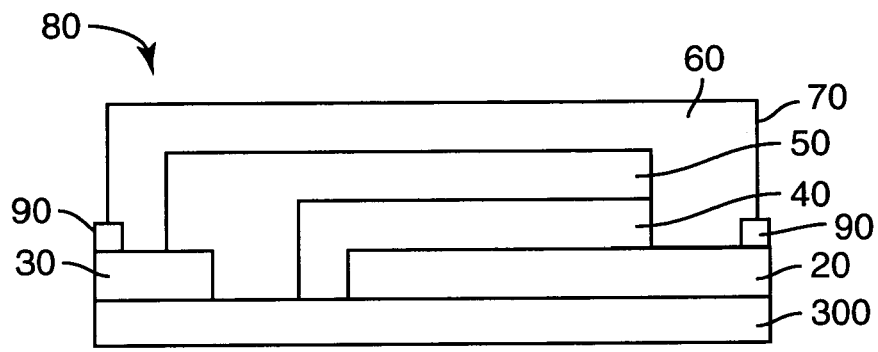
FIG. 2 is a schematic cross-sectional view of a prior art organic electroluminescent device.

FIG. 2 is a schematic cross-sectional view of a known organic electroluminescent device 80. A first conductive layer is disposed on a substrate 300. A portion of the conductive layer is removed or patterned, for example, by etching to create an anode 20 and an electrical contact 30. A light emitting structure 40 is disposed on part of the surface of the anode 20 opposite the substrate 300. The light emitting structure typically fills part of the patterned area between the anode 20 and the electrical contact 30. A cathode 50 is disposed on the light emitting structure 40 such that the light emitting structure 40 is between the anode 20 and the cathode 50. The cathode 50 extends into the patterned area and is in electrical communication with the electrical contact 30. The light emitting structure 40 and the cathode 50 are covered with a metal can 70 to reduce exposure of these components of the device to oxygen and moisture. The metal can 70 is insulated from the anode 20 and electrical contact 30 by electrical insulating bodies 90. A gap 60 electrically insulates the metal can 70 from the second electrode 50.

As used herein, the term "pattern" means that a component (e.g., electrode or conductive layer) is divided into two or more non-connected parts. In some embodiments, the component is patterned by removal of part of the component. For example, the component can be etched. In other embodiments, the component is patterned by deposition of the component in two or more areas that are not connected. For example, masks or printing methods can be used to deposit the component. A "non-patterned" component refers to a component that has not been divided into two or more non-connected parts.

A device as shown in FIG. 2 is usually prepared using photolithographic processes to pattern the first conductive layer to form the anode 20 and electrical contact 30. Such processes require the use of strong acids, for example, to etch the conductive layer. Other manufacturing methods are desired.

The cathode and the light emitting structure are typically both sensitive to degradation by moisture and oxygen. Encapsulation methods are desirable that can extend the useful life of the organic electroluminescent devices.

The organic electroluminescent devices of the present invention include, but are not limited to, a first electrode, a second electrode, a light emitting structure, a conductive layer, and a non-conductive material. The light emitting structure is disposed between the first and second electrode. The conductive layer can be disposed on at least a portion of the second electrode and is in electrical communication with the second electrode through at least one opening defined in the non-conductive material.

As used herein, the term "non-conducting" or "non-conductive" refers to a material that does not conduct electricity. Similarly, as used herein, the term "conducting" or "conductive" refers to a material that conducts electricity.

Figure 3:
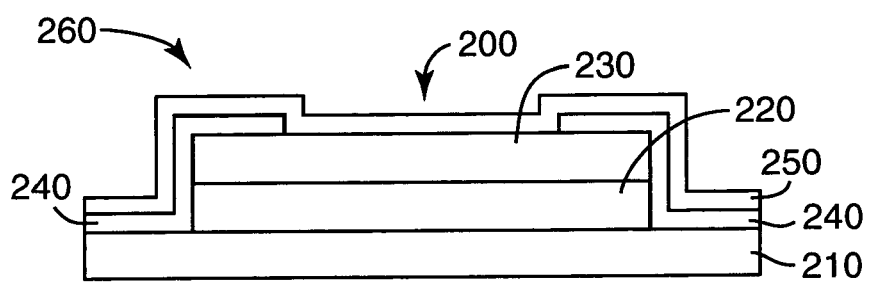
FIG. 3 is a schematic cross-sectional view of one embodiment of an organic electroluminescent device.

FIG. 3 is a schematic cross-sectional view of one embodiment of an organic electroluminescent device 260 according to the invention. A light emitting structure 220 is disposed between a first electrode 210 and a second electrode 230. The light emitting structure 220 is in electrical communication with both electrodes 210 and 230. A non-conductive layer 240 defines an opening 200. The opening 200 is positioned in an area of a surface of the second electrode 230, such as in an area of the surface that is opposite the light emitting structure 220. A conductive layer 250 is typically in electrical communication with the second electrode 230 through the opening 200 defined by the non-conductive layer 240.

As shown in FIG. 3, the opening 200 in the non-conductive material 240 can be positioned entirely within an area of a surface of the second electrode 230, such as the surface opposite the light emitting structure 220. The area of the opening 200 is smaller than the area of the surface of the second electrode 230 on which the opening is positioned. The non-conductive material 240 can separate the conductive layer 250 from the second electrode 230 near the outer edges of the second electrode 230.

In some embodiments, the second electrode can extend beyond the outer periphery of the light emitting structure. For example, in FIG. 2 the second electrode (cathode 50) extends beyond the light emitting structure 40. In such an embodiment, the opening in the non-conductive layer can be positioned in an area of the second electrode directly above the light emitting structure or positioned in an area of the second electrode that is not directly above the light emitting structure.

The conductive layer 250 in FIG. 3 can be bonded to the non-conductive layer 240, both of which can extend beyond the outer periphery of the second electrode 230. The non-conductive layer can separate the conductive layer from other active components of the device such as, for example, the light emitting structure, the first electrode, or a combination thereof.

The non-conductive material 240 can be bonded to other components of the OEL device. For example, in FIG. 3, the non-conductive material 240 can be bonded to the first electrode 210 beyond the outer periphery of the second electrode 230. Bonding one surface of the non-conductive material can function as a seal and reduce exposure of the light emitting material and the second electrode to moisture or oxygen.

Figure 15:
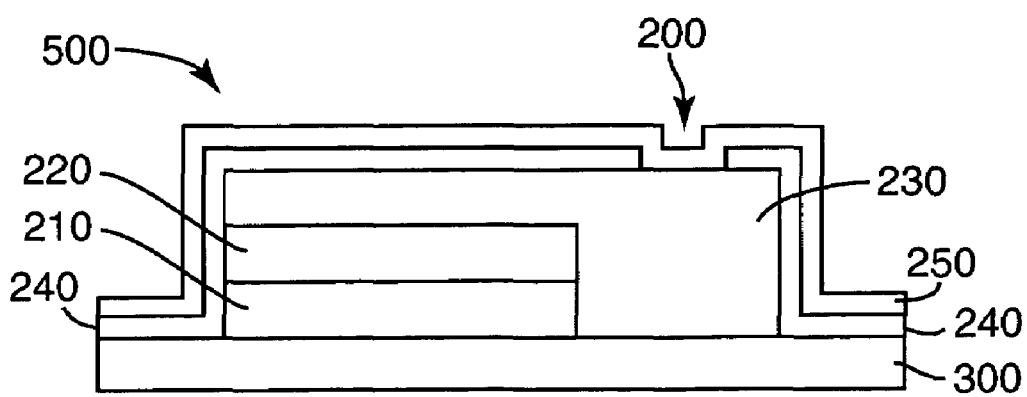
FIG. 15 is a schematic cross-sectional view of one embodiment of an organic electroluminescent device in which the opening in the non-conductive layer is in an area of the second electrode that is not directly above the light emitting structure.

FIG. 15 is a schematic cross-sectional view of one embodiment of an organic electroluminescent device 500 in which the opening 200 in the non-conductive layer 240 is in an area of the second electrode 230 that is not directly above the light emitting structure 230.

The various components included in the organic electroluminescent devices can provide encapsulation. As used herein, the term "encapsulated" refers to an organic electroluminescent device having a light emitting structure and a second electrode free of surfaces that are exposed to oxygen. Depending on the composition of the various components, the useful lifetime of the organic electroluminescent device can be extended by encapsulation. For example, some electrode materials and light emitting structures deteriorate upon prolonged exposure to oxygen, moisture, or a combination thereof. Encapsulation reduces contact of the second electrode or the light emitting structure with oxygen or moisture. In FIG. 3, the combination of the first electrode 210, the non-conductive layer 240, and the conductive layer 250 can encapsulate the second electrode 230 and the light emitting structure 220. Various other components or structures can be added to provide encapsulation. For example, in some embodiments, substrates, barrier layers, edge seals, or a combination thereof are included to further encapsulate the device.

As shown in FIG. 3 and many of the other figures included in the application, the first electrode 210 does not extend beyond the outer periphery of the conducting layer 250 and the non-conductive material 240. However, in some embodiments, the first electrode is prepared from a material that is not reactive with oxygen or moisture. As such, the first electrode does not need to be encapsulated and can extend beyond the part of the device that is encapsulated.

The second electrode 230 and the light emitting structure 220 are shown as being the same size in FIG. 3. In other embodiments, these components do not have the same dimensions. For example, OEL device 270 shown in FIG. 4 includes a second electrode 230 having a shorter length, width, or a combination thereof than the light emitting structure 220. A conductive layer 250 is in electrical communication with a surface of the second electrode 230, such as the surface that is opposite the light emitting structure 220. The entire area of this surface of the second electrode 210 is in contact with a conducting layer 250. That is, there is no non-conductive material 240 disposed on the surface of the second electrode 230 where the opening 200 is positioned.

Figure 5:
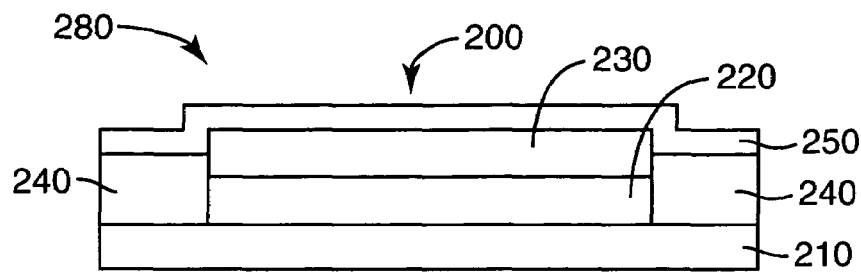
FIG. 5 is a schematic cross-sectional view of yet another embodiment of an organic electroluminescent device.

Another embodiment of an OEL device 280 is shown schematically in FIG. 5. The length and width of the second electrode 230 are similar to the corresponding dimensions of the light emitting structure 220 and the thickness of the non-conductive material 240 is at least equal to the thickness of the light emitting structure 220. The entire area of this surface of the second electrode 230 is in contact with a conducting layer 250. That is, there in no non-conductive material 240 disposed on the surface of the second electrode 230 where the opening 200 is positioned.

Figure 4:
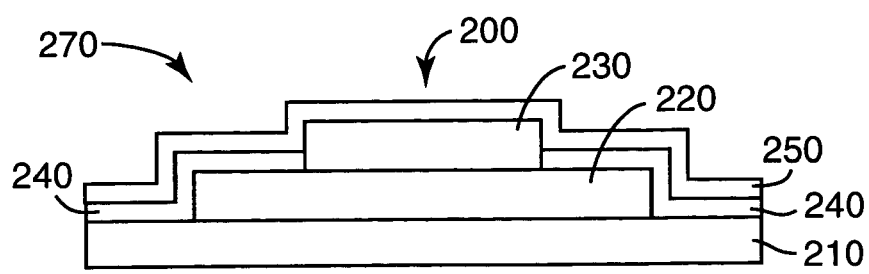
FIG. 4 is a schematic cross-sectional view of another embodiment of an organic electroluminescent device.

In FIGS. 4 and 5, the opening 200 in the non-conductive material 240 can be positioned in an area of a surface of the second electrode 230, such as the surface that is opposite the light emitting structure 220. The conductive layer 250 can be bonded to a non-conductive material 240 beyond the outer periphery of the second electrode 230. The non-conductive material 240 separates the conductive layer from the first electrode 210, the light emitting structure 220, or a combination thereof beyond the outer periphery of the second electrode 230. The non-conductive material can be bonded to other components beyond the outer periphery of the second electrode 230.

The first and second electrodes include conducting materials such as metals, alloys, metallic compounds, metal oxides, conductive ceramics, conductive dispersions, and conductive polymers. Suitable materials can contain, for example, gold, platinum, palladium, nickel, aluminum, calcium, barium, magnesium, titanium, titanium nitride, indium tin oxide (ITO), fluorine tin oxide (FFO), graphite, and polyaniline. The electrodes can have a single layer or multiple layers of conductive materials. For example, an electrode can include a layer of aluminum and a layer of gold, a layer of calcium and a layer of aluminum, a layer of aluminum and a layer of lithium fluoride, or a metal layer and a conductive organic layer. For many applications, such as display applications, at least one of the electrodes can transmit radiation emitted by the light emitting structure.

In some embodiments, the first electrode is an anode and the second electrode is a cathode. The anode can be prepared from a material having a high work function (e.g., above about 4.5 eV). Typically, the anode can transmit radiation emitted by the light emitting structure. Suitable materials include a thin layer of electronegative metals such as gold, platinum, nickel, graphite, silver, or combinations thereof. The anode can also be prepared from a metal oxide such as, for example, indium-tin oxide.

The cathode can be prepared from a material having a low work function (e.g., below about 4.5 eV). Suitable materials include n-doped silicon, alkali metals, alkaline earth metals, and the like. For example, the cathode can contain lithium, calcium, barium, magnesium, or combinations thereof. Such cathode materials have a tendency to react with water, oxygen, or a combination thereof and can be advantageously protected by encapsulation.

Methods for preparing the electrodes include, but are not limited to, sputtering, vapor deposition, laser thermal patterning, inkjet printing, screen printing, thermal head printing, and photolithographic patterning. The electrodes are most commonly prepared by vapor deposition.

The light emitting structure typically contains at least one organic electroluminescent material. The electroluminescent material includes, but is not limited to, fluorescent or phosphorescent material. The organic electroluminescent material can include, for example, a small molecule (SM) emitter (e.g., a non-polymeric emitter), a SM doped polymer, a light emitting polymer (LEP), a doped LEP, or a blended LEP. Suitable organic electroluminescent material is described in U.S. Pat. No. 6,358,664 and U.S. patent application Ser. Nos. 09/662,980; 09/931,598; and 10/254,237, incorporated herein by reference in their entirety. The organic electroluminescent material can be provided alone or in combination with any other organic or inorganic materials that are functional or non-functional in an organic electroluminescent display or device.

In some embodiments, the organic electroluminescent material includes a light emitting polymer. LEP materials are typically conjugated polymeric or oligomeric molecules that preferably have sufficient film-forming properties for solution processing. As used herein, "conjugated polymers or oligomeric molecules" refer to polymers or oligomers having a delocalized π-electron system along the polymer backbone. Such polymers or oligomers are semiconducting and can support positive and negative charge carriers along the polymeric or oligomeric chain.

Examples of classes of suitable LEP materials include poly(phenylenevinylenes), poly(para-phenylenes), polyfluorenes, other LEP materials now known or later developed, and co-polymers or blends thereof. Suitable LEPs can also be molecularly doped, dispersed with fluorescent dyes or photoluminescent materials, blended with active or non-active materials, dispersed with active or non-active materials, and the like. Examples of suitable LEP materials are described in Kraft, et al., Angew. Chem. Int. Ed., 37, 402–428 (1998); U.S. Pat. Nos. 5,621,131; 5,708,130; 5,728,801; 5,840,217; 5,869,350; 5,900,327; 5,929,194; 6,132,641; and 6,169,163; and PCT Patent Application Publication No. 99/40655, all of which are incorporated herein by reference.

LEP materials can be formed into a light emitting structure, for example, by casting a solvent solution of the LEP material on a substrate and evaporating the solvent to produce a polymeric film. Alternatively, LEP material can be formed in situ on a substrate by reaction of precursor species. Suitable methods of forming LEP layers are described in U.S. Pat. No. 5,408,109, incorporated herein by reference. Other methods of forming a light emitting structure from LEP materials include, but are not limited to, laser thermal patterning, inkjet printing, screen printing, thermal head printing, photolithographic patterning, and extrusion coating. The light emitting structure can include a single layer or multiple layers of LEP material or other electroluminescent material.

In some embodiments, the organic electroluminescent material can include one or more small molecule emitters. SM electroluminescent materials include charge transporting, charge blocking, and semiconducting organic or organometallic compounds. Typically, SM materials can be vacuum deposited or coated from solution to form thin layers in a device. In practice, multiple layers of SM materials are typically used to produce efficient organic electroluminescent devices since a given material generally does not have both the desired charge transport and electroluminescent properties.

SM materials are generally non-polymeric organic or organometallic materials that can be used in OEL displays and devices as emitter materials, charge transport materials, dopants in emitter layers (e.g., to control the emitted color), charge transport layers, and the like. Commonly used SM materials include N,N'-bis(3-methylphenyl)-N,N'-diphenyl-benzidine (TPD) and metal chelate compounds such as tris(8-hydroxyquinoline) aluminum (AlQ). Other SM materials are disclosed in, for example, C. H. Chen, et al., Macromol. Symp. 125, 1 (1997); Japanese Laid Open Patent Application 2000-195673; U.S. Pat. Nos. 6,030,715; 6,150, 043; and 6,242,115; and PCT Patent Applications Publication Nos. WO 00/18851 (divalent lanthanide metal complexes), WO 00/70655 (cyclometallated iridium compounds and others), and WO 98/55561, all of which are incorporated herein by reference.

The organic electroluminescent devices can optionally include a hole transporting layer, an electron transport layer, a hole injection layer, an electron injection layer, a hole blocking layer, an electron blocking layer, a buffer layer, and the like. These and other layers and materials can be used to alter or tune the electronic properties and characteristics of the OEL devices. For example, such layers and materials can be used to achieve a desired current/voltage response, a desired device efficiency, a desired brightness, and the like. Additionally, photoluminescent materials can be present to convert the light emitted by the organic electroluminescent materials to another color. These optional layers can be positioned between the two electrodes and can be part of the light emitting structure or a separate layer.

For example, the organic electroluminescent device can optionally include a hole transport layer between the light emitting structure and one of the first or second electrodes. The hole transport layer facilitates the injection of holes into the device and the migration of the holes towards the cathode. The hole transport layer can further act as a barrier for the passage of electrons to the anode. The hole transport layer can include, for example, a diamine derivative, such as N,N'-bis(3-methylphenyl)-N,N'-bis(phenyl)benzidine, N,N'-bis(3-naphthalen-2-yl)-N,N-bis(phenyl)benzidine, or a triarylamine derivative, such as 4,4',4"-tris(N,N'-diphenylamino)triphenylamine, or 4,4',4"-tris(N-3-methylphenyl-N-phenylamino)triphenylamine. Other examples include copper phthalocyanine and 1,3,5-tris(4-diphenylaminophenyl) benzenes. Further suitable compounds that can be included in the hole transport layer are described in H. Fujikawa, et al., *Synthetic Metal*, 91, p. 161 (1997) and J. V. Gravulevicius, and P. Strohriegl, "Charge Transporting Polymers and Molecular Glasses," *Handbook of Advanced Electronic and Photonic Materials and Devices*, H. S. Nalwa (ed.), 10, pp. 233–274 (2001).

The organic electroluminescent device can optionally include an electron transport layer between the light emitting structure and one of the first or second electrodes. The electron transport layer facilitates the injection of electrons and their migration towards the recombination zone. The electron transport layer can further act as a barrier for the passage of holes to the cathode. Suitable materials for the electron transport layer include, for example, tris(8-hydroxyquinolato) aluminum, 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole, and other compounds described in C. H. Chen et al., Macromol. Symp., 125, 1 (1997) and J. V. Gravulevicius, and P. Strohriegl, "Charge Transporting Polymers and Molecular Glasses," *Handbook of Advanced Electronic and Photonic Materials and Devices*, H. S. Nalwa (ed.), 10, pp. 233–274 (2001).

In one embodiment, the electrodes, the light emitting structure, other optional layers, or a combination thereof can be formed by transferring one or more layers by laser thermal patterning as described in, for example, U.S. Pat. Nos. 6,485,884; 6,482,564; 6,284,425; 6,242,152; 6,228,555; 6,228,543; 6,221,553; 6,221,543; 6,214,520; 6,194,119; 6,114,088; 5,998,085; 5,725,989; 5,710,097; 5,695,907; and 5,693,446; in co-assigned Published U.S. patent application 20020158574; and in co-assigned U.S. patent application Ser. Nos. 09/662,980; 09/451,984; 09/931,598; and 10/004,706, all of which are incorporated herein by reference. For example, the organic electroluminescent material can be coated on a donor sheet and then selectively transferred alone or in combination with other layers or with one or more electrodes to a receptor sheet. The receptor sheet can be pre-patterned with one or more electrodes, transistors, capacitors, insulator ribs, spacers, color filters, black matrix, hole transport layers, electron transport layers, other elements suitable for electronic displays and devices, or a combination thereof.

The organic electroluminescent devices of the invention also include a non-conductive material that defines an opening through which the conductive layer is in electrical communication with the second electrode. The non-conductive material can include, but is not limited to, ceramic material, glass material, polymeric material, and the like.

The non-conductive material typically extends beyond the outer periphery of the second electrode. This material can function, for example, to separate the conductive layer from the first electrode beyond the periphery of the second electrode. The non-conductive layer material can be bonded to part of any of the other components of the OEL device. The non-conductive material can also function in conjunction with the conductive layer, the first electrode, a substrate, or a combination thereof to encapsulate the light emitting structure and the second electrode. Encapsulation can seal the device and reduce migration of water or oxygen from outside the organic electroluminescent device to the light emitting structure, the second electrode, or a combination thereof. Encapsulation can extend the useful lifetime of some organic electroluminescent devices.

In some embodiments, the non-conductive material is a polymeric material. Suitable polymeric materials include thermoplastic or thermosetting homopolymers and thermoplastic or thermosetting copolymers. The non-conducting polymeric material can be curable or non-curable. Examples of non-conductive polymeric materials that can be used include polyurethanes, polyolefins, polyacrylates, polyesters, polyamides, epoxies, or combinations thereof. In some embodiments, the non-conductive polymeric material is an adhesive such as a hot melt adhesive or a pressure sensitive adhesive. The adhesive can be tacky or non-tacky at room temperature. The acidity of the polymeric material should not be high enough to cause corrosion of the electrodes.

The non-conductive polymeric material can be applied as a pre-formed layer or as a solution or dispersion. In some embodiments, a pre-formed non-conductive layer is used such as an adhesive layer. Examples of a suitable non-conductive layer include ethylene vinyl acetate or modified polyolefin thermoplastics such as 3M™ Thermo-bond (available from 3M of St. Paul, Minn.).

The non-conductive material can include a desiccant such as, for example, calcium oxide. A suitable hot melt adhesive containing a desiccant is DeSiMax™ from Multisorb Technologies Inc. (Buffalo, N.Y.).

An opening is made in the non-conductive layer. The opening is positioned in an area of a surface of the second electrode, such as in an area of the surface that is opposite the light emitting structure. The length and width of the opening are typically about equal to or smaller than the corresponding dimensions of the surface of the second electrode. The conductive layer is in electrical communication with the second electrode through the opening in the non-conductive layer.

The pre-formed non-conductive layer preferably does not contain particulates of a size that could lead to electrical shorting of the device when the layer is bonded to both the conductive layer and the first electrode beyond the outer periphery of the second electrode. The thickness should be thick enough to prevent the conductive layer from shorting the first and second electrodes beyond the outer periphery of the second electrode. The thickness should not be so thick, however, that the conductive layer cannot be adequately deformed to provide electrical communication between the conductive layer and the second electrode through the opening defined in the non-conductive material. The typical thickness of the pre-formed non-conductive layer is in the range of about 0.5 mils (0.012 mm) to about 2 mils (0.05 mm).

In some embodiments, as shown in FIG. 3, the opening 200 in the non-conductive layer 240 is positioned over less than the entire surface of the second electrode 230, such as the surface that is opposite the light emitting structure 220. The non-conductive material 240 is disposed on part of this surface of the second electrode 230 and extends beyond the outer periphery of the second electrode 230. In other embodiments, as shown in FIGS. 4 and 5, the opening 200 in the non-conductive layer 240 is positioned over an entire surface of the second electrode 230, such as the surface that is opposite the light emitting structure 220. The non-conductive material 240 is not disposed on any part of this surface of the second electrode 230. That is, the entire surface where the opening is positioned is in contact with conductive material.

The non-conductive material can be applied as a solution or dispersion rather than as a pre-formed film. Such material can be applied, for example, using printing methods or masking off regions. As shown in FIG. 3, the non-conductive material 240 can be applied to the outer edges of a surface of the second electrode 230, such as the surface that is opposite the light emitting structure 220. As shown in FIGS. 4 and 5, an OEL can be prepared without any non-conductive material 240 applied to the surface of the second electrode 230.

The non-conductive material can also be applied to part of the other components to encapsulate the OEL device. As shown in FIGS. 3 and 5, the non-conductive material can be applied to edges of the light emitting structure 220 and to part of a surface of the first electrode 210. In FIG. 4, the non-conductive material 240 is applied to part of one surface of the light emitting structure 220, the edges of the light emitting structure 220, and part of a surface of the first electrode 210.

The same types of conductive materials that can be used in the form of a pre-formed layer can be used in the form of a dispersion or solution. The compositions preferably do not contain compounds that are reactive with other materials in the device and contain a minimum of species that can migrate through the various layers of the device.

The conductive layer includes materials such as metals, metallic alloys, metallic compounds such as metal oxides, conductive ceramics, and conductive polymers. In some embodiments, the conductive layer can include a metal or metallic compound containing gold, silver, copper, indium tin oxide, aluminum, and the like.

The conductive layer can be a deformable film. Suitable deformable films include metals such as copper, silver, gold, aluminum, or the like. The conductive layer typically has a thickness in the range of about 1 to about 2 mils (about 0.025 to about 0.05 mm). The surface roughness of the conductive layer is preferably less than the thickness of the cathode (e.g., about 100 to 300 nm). The conductive layer is preferably free of defects such as pinholes that would allow introduction of moisture or oxygen into the organic electroluminescent device.

The conductive layer can contact a surface of the second electrode directly or be separated from the second electrode by another conductive material such as, for example, a conductive polymeric adhesive. By providing a conductive layer having low resistivity in electrical communication with the second electrode, the resulting organic electroluminescent device can advantageously have substantial illumination over a large area without significant loss of illumination intensity across the device.

In some embodiments, an entire surface of the second electrode, such as the surface opposite the light emitting structure, is in direct contact with the conductive layer. In other embodiments, all but the outer portion of a surface of the second electrode, such as the surface opposite the light emitting structure, is in direct contact with the conductive layer through a single opening in the non-conductive material. In still other embodiments, a surface of the second electrode, such as the surface opposite the light emitting structure, is in direct contact with the conducting layer through multiple openings in the non-conductive material.

Figure 13:
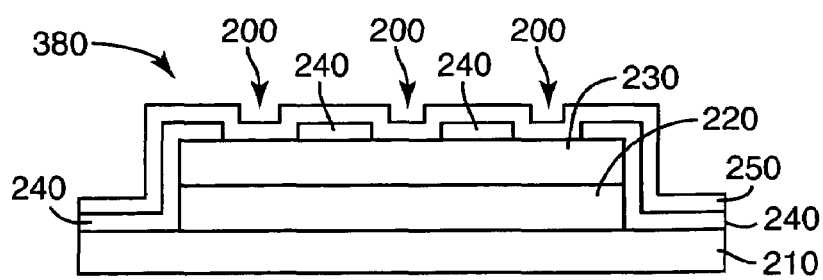
FIG. 13 is a schematic cross-sectional view of one embodiment of an organic electroluminescent device having multiple openings in a non-conductive material through which the conductive layer can be in electrical communication with the second electrode.

The openings can have any desired shape. The shape can be regular or irregular. When multiple opening are present, the shape of the openings can be uniform or non-uniform. The multiple openings can be arranged in any desired configuration that is ordered or random. For example, FIG. 13 shows a schematic cross-sectional view of an embodiment in which the organic electroluminescent device 380 includes a plurality of openings 200 in the non-conductive material 240 through which contact can be made between the conductive layer 250 and the second electrode 230. The multiple openings can be arranged in a linear arrangement.

Figure 6A:
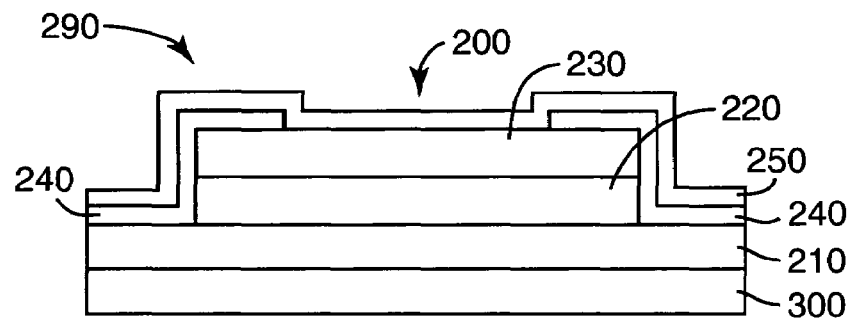
FIG. 6A is a schematic cross-sectional view of one embodiment of an organic electroluminescent device having a substrate.

The organic electroluminescent device can further include a substrate. For example, as shown schematically in FIG. 6A for device 290, the first electrode 210 can be disposed on a substrate 300. The first electrode 210 is positioned between the substrate 300 and the light emitting structure 220. The substrate 300 is typically transparent. As used herein, "transparent" refers to a material that transmits at least some of the light emitted by the electroluminescent material in the light emitting structure. The substrate can be flexible or rigid.

Suitable rigid transparent substrates include, for example, glass, polycarbonate, acrylic, and the like. Suitable flexible transparent substrates include for example, polyesters (e.g., polyethylene terephthalate, polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, and other conventional polymeric films.

Figure 14A:
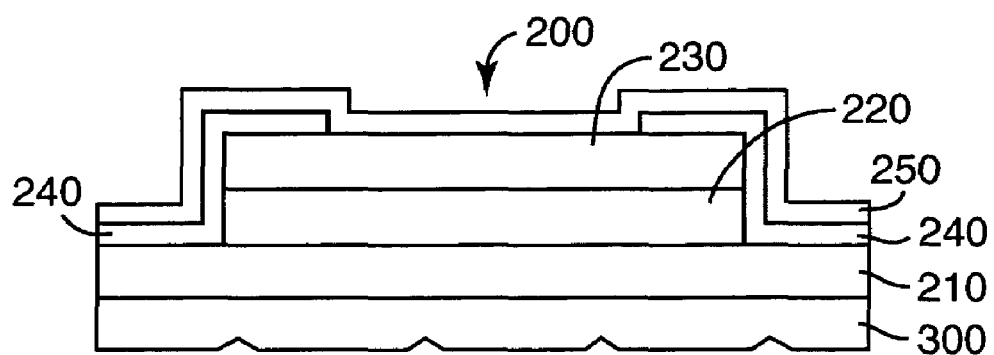
FIG. 14a is a schematic cross-sectional view of one embodiment of an organic electroluminescent device having V-shaped notches across the substrate.
Figure 14B:
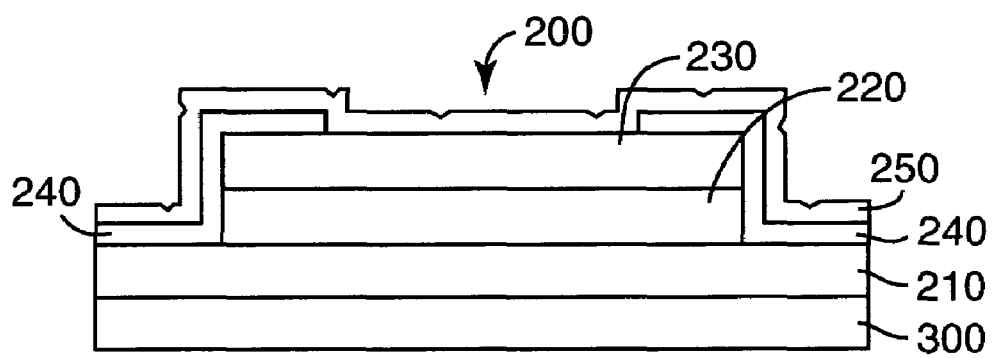
FIG. 14b is a schematic cross-sectional view of one embodiment of an organic electroluminescent device having V-shaped notches across the conductive layer.

The substrate, the conductive layer, or both can be notched to enhance flexibility of the device. The notches can be in one direction or multiple directions across the substrate, conductive layer, or both. The notches can have a variety of shapes such as slits, V-shaped, or U-shaped. The notches typically extend to less than about 50 percent of the thickness of the substrate or the conductive layer. FIG. 14a is a schematic cross-sectional view of one embodiment of an organic electroluminescent device having V-shaped notches across the substrate. FIG. 14b is a schematic cross-sectional view of one embodiment of an organic electroluminescent device having V-shaped notches across the conductive layer.

Figure 6B:
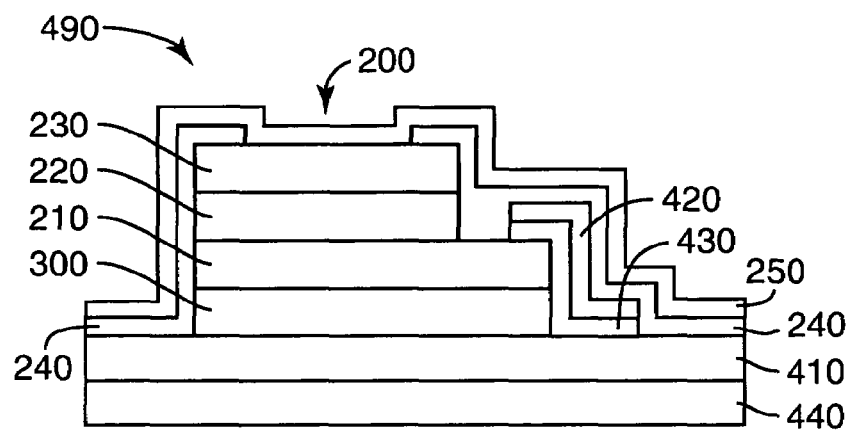
FIG. 6B is a schematic cross-sectional view of one embodiment of an organic electroluminescent device having two substrates.

The organic electroluminescent device can include two substrates as shown in FIG. 6B for device 490. The first electrode 210 is disposed on a first substrate 300. Substrate 300 can be laminated to a second conductive layer 410 disposed on a second substrate 440. The first electrode 210 is in electrical contact with the second conductive layer 410 through electrical interconnect 420 and electrical interconnect attachment layer 430. The light emitting structure 220 is disposed on the first electrode 210. The second electrode 230 is disposed on the light emitting structure 220. A first conductive layer 250 is in electrical communication with the second electrode 230 through an opening 200 defined in the non-conductive material 240. The electrical interconnect 420 and the electrical interconnect attachment layer 430 are electrically insulated from the second electrode 230 and the first conductive layer 250 by the non-conductive material 240.

In this embodiment, the first electrode, second electrode, and light emitting structure can be formed on the first substrate 300. This assembly can then be attached to the second conductive layer 410 and the second substrate to provide further protection for the reactive components in the device.

In FIG. 6B, the electroluminescent structure that includes the first electrode 210, the light emitting structure 220, and the second electrode 230 is encapsulated on one side by the first substrate 300, the second conductive layer 410, and the second substrate 440. The electroluminescent structure is encapsulated on the opposite side by the non-conductive layer 240 and the first conductive layer 250. The anode contact is the second conductive layer 410 and the cathode contact is the first conductive layer 250. The device 490 can be hermetically sealed without having to pattern the device anode.

In some embodiments, the electrical interconnect 420 and electrical interconnect attachment layer 430 is a single layer such as solder. In other embodiments, the electrical interconnect layer 420 is a metal foil, a metal wire, or a metallized plastic and the electrical interconnect attachment layer 430 is a conductive adhesive or solder. The electrical interconnect layer 420 and the electrical interconnect attachment layer 430 both conduct electricity.

Suitable materials for the second conductive layer 410 are typically transparent and includes a thin layer of electronegative metals such as gold, platinum, nickel, graphite, silver, or combinations thereof. This layer can also be prepared from a metal oxide such as, for example, indium-tin oxide. In some embodiments, the second conductive layer is patterned.

The second substrate 440 can be prepared from the same materials as the first substrate 300. For example, the second substrate can be prepared from glass, polycarbonate, acrylic, polyesters (e.g., polyethylene terephthalate, polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, and other conventional polymeric films. The second substrate can include a barrier construction, examples of which are described later.

Figure 6C:
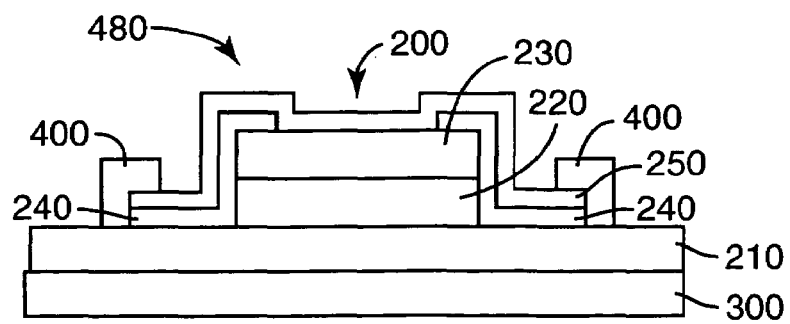
FIG. 6C is a schematic cross-sectional view of an organic electroluminescent device having a substrate and edge seals.

FIG. 6C is a schematic cross-sectional view of an organic electroluminescent device 480 having a substrate and edge seals 400 to further encapsulate the second electrode 230 and light emitting structure 220. The edge seals 400 can be prepared from a plastic material such as a polyolefin or epoxy. A desiccant material such as calcium oxide can be include in the composition used to prepare the edge seals.

Figure 6D:
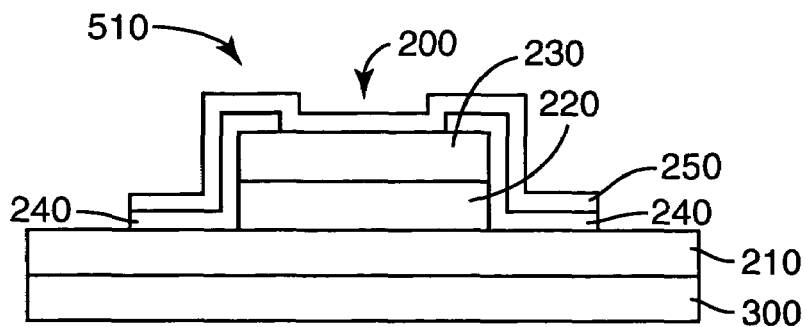
FIG. 6D is a schematic cross-sectional view of an OEL device having a substrate and a first electrode that extend beyond the outer periphery of the other components of the device.

As shown in FIG. 6C for device 480 with edge seals 400 and in FIG. 6D for device 510 without edge seals, the first electrode 210 can extend beyond the outer periphery of the non-conductive material 240 and the conductive layer 250. Such a device can be prepared using a material for the first electrode 210 that is not reactive with oxygen or moisture. Suitable materials for the first electrode include, for example, gold, platinum, nickel, graphite, silver, or combinations thereof. This electrode can also be prepared from a metal oxide such as, for example, indium-tin oxide. The non-conductive material 240 can be bonded to both the conductive layer 250 and the first electrode beyond the periphery of the second electrode.

Figure 7:
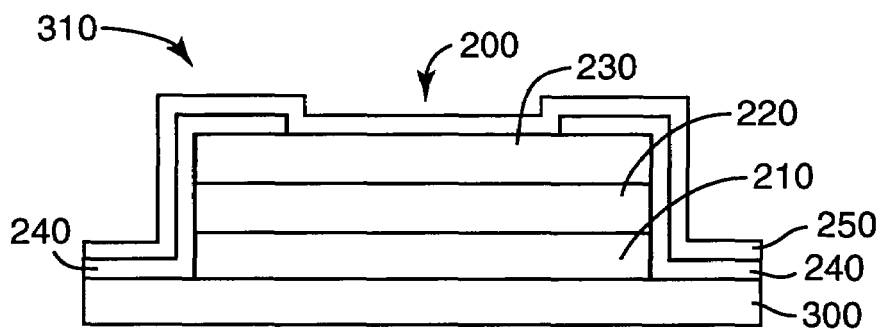
FIG. 7 is a schematic cross-sectional view of another embodiment of an organic electroluminescent device having a substrate

FIG. 7 shows a schematic cross-sectional view of another embodiment of an organic electroluminescent device 310 that includes a substrate. The non-conductive polymeric material 240 and a conductive layer 250 are laminated to the substrate 300 rather than to the first electrode as shown in FIGS. 3, 4, 5, and 6a–d. In this embodiment, the first electrode 210, second electrode 230, and light emitting structure 220 are encapsulated by the combination of the substrate 300, the conductive layer 250, and the non-conductive material 240. This embodiment can be used advantageously when the first electrode 210 is constructed of a material that can react with moisture or oxygen.

When both of the electrodes are reactive with oxygen or moisture, the first electrode 210 can be in electrical communication with a non-reactive conductive material that extends beyond the device. For example, vias can pass through the substrate and the vias can contain a non-reactive conductive material.

Figure 8:
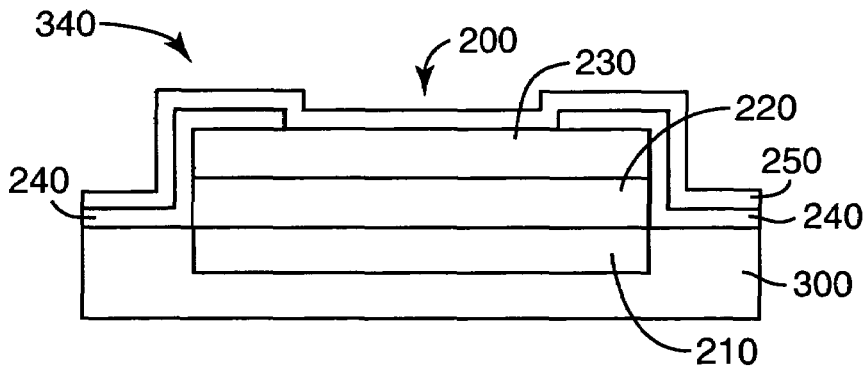
FIG. 8 is a schematic cross-sectional view of yet another embodiment of an organic electroluminescent device having a substrate.

FIG. 8 shows a schematic cross-sectional view of yet another embodiment of an organic electroluminescent device 340 that includes a substrate 300. The first electrode 210 can be disposed in a well. The well can be formed, for example, by removal of part of the substrate, such as by etching. Alternatively, the well can be formed by printing an electrode and a non-conductive material on the surface of the substrate in the form of, for example, parallel stripes or a grid.

The substrate can include any number of devices or components suitable in OEL devices or displays. Suitable devices or components include, for example, transistor arrays and other electronic devices; color filters, polarizers, wave plates, diffusers, and other optical devices; insulators, barrier ribs, black matrix, mask work and other such components; and the like.

The substrate can include a barrier construction. As used herein, the term "barrier construction" refers to a structure that reduces the migration of moisture, oxygen, or a combination thereof across the substrate to contact the light emitting structure and the electrodes of the organic electroluminescent device. The barrier construction is typically transparent and can include one or more layers. Exemplary barrier constructions can contain a plurality of layer pairs (i.e., dyads) that include a barrier material layer and polymeric smoothing material layer supported on a substrate. In some embodiments, the lifetime of the organic electroluminescent device can be extended by the use of a barrier construction.

The barrier construction can include a metal containing layer. The metal containing layer typically includes a metal oxide, metal nitride, metal carbide, metal oxynitride, or a combination thereof. Suitable materials for the metal containing layer include, for example, silicon oxide, aluminum oxide, titanium oxide, indium oxide, tin oxide, zirconium oxide, indium tin oxide, aluminum nitride, silicon nitride, boron nitride, silicon carbide, and aluminum oxynitride, silicon oxynitride, and boron oxynitride. In some embodiments, the metal containing layer includes a metal oxide such as aluminum oxide or indium tin oxide. Suitable materials are described in U.S. Pat. Nos. 6,231,939 and 5,725,909 and PCT Patent Applications Publication No. WO 00/26973, all of which are incorporated herein by reference in their entirety.

The metal containing layer of the barrier construction is typically less than about 300 nm thick. The barrier construction can also include at least one polymeric layer in addition to the metal containing layer. For example, the barrier construction can be prepared by laminating alternating layers of polymeric layers and metal containing layers.

Figure 9:
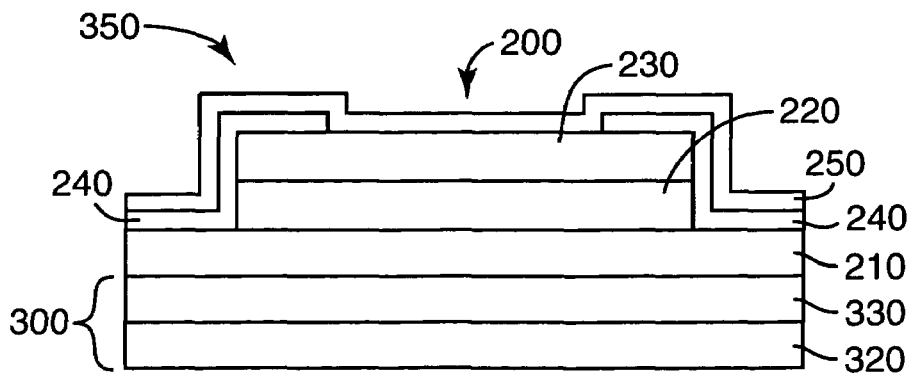
FIG. 9 is a schematic cross-sectional view of one embodiment of an organic electroluminescent device having a substrate that includes a barrier construction.

FIG. 9 shows a schematic cross-sectional view of an OEL device 350 that includes a substrate 300 having a metal containing layer 330 and a polymeric layer 320. The polymeric layer 320 of the barrier construction typically contains polyacrylates, polyesters, polyolefins, or combinations thereof. In FIG. 9, the metal containing layer 330 of the barrier construction is between the first electrode 210 and the polymeric layer 320. In other embodiments the polymeric layer 320 is adjacent to the first electrode 210. The polymeric layer can function to preserve the integrity of the thin metal containing layer. Minor cracks or defects in the metal containing layer can increase the migration of moisture and oxygen across the barrier construction into contact with the second electrode, the light emitting structure, or a combination thereof. A plurality of layer pairs of polymeric and metal containing layers typically increases the resistance to migration of moisture and oxygen.

Figure 10A:
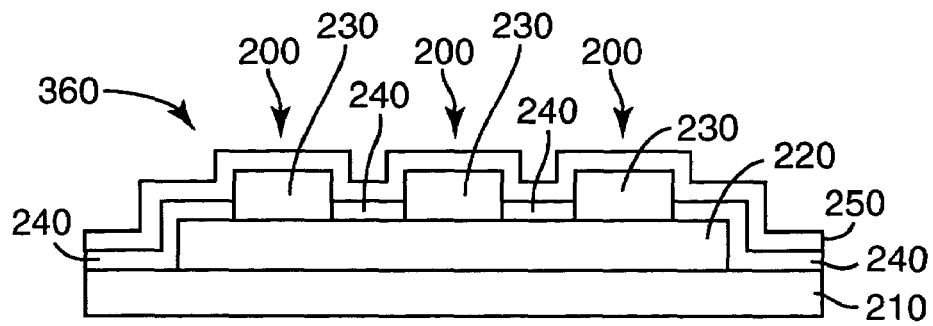
FIG. 10A is a schematic cross-sectional view of one embodiment of an organic electroluminescent device having a plurality of second electrodes.
Figure 10B:
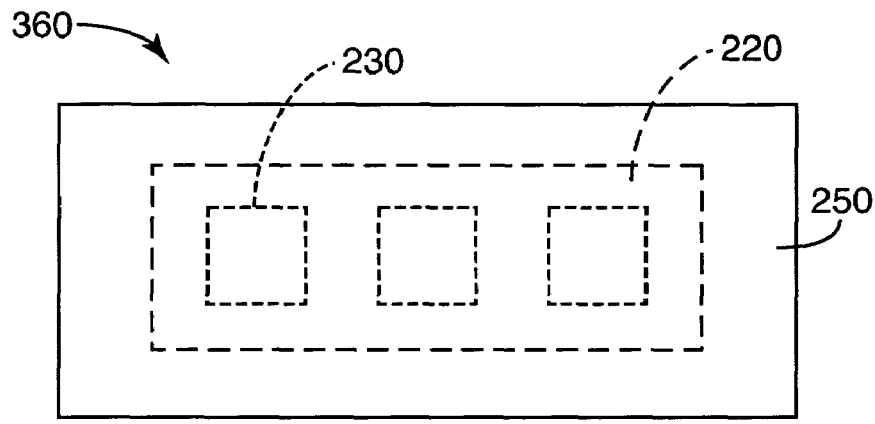
FIG. 10B is the corresponding schematic top view of this embodiment.

An electroluminescent device of the invention can include a plurality of first electrodes, a plurality of organic electroluminescent materials, a plurality of second electrodes, or a combination thereof. FIG. 10A shows a schematic cross-sectional view of an embodiment in which the organic electroluminescent device 360 includes a plurality of second electrodes 230. FIG. 10B shows a schematic top view of the same device. The plurality of second electrodes 230 can be arranged linearly or in any configuration over the first electrode 210 and the light emitting structure 220.

The organic electroluminescent device 360 shown in FIG. 10A and FIG. 10B can be prepared by disposing a light emitting structure 220 on a first electrode 210. Multiple second electrodes 230 can be disposed on the surface of the light emitting structure 220 opposite the first electrode 210. Multiple opening 200 can be defined in a non-conductive material 240. The openings 200 can be positioned entirely within an area of a surface of the second electrode, such as the surface opposite the light emitting structure. The non-conductive material 240 is disposed between each of the second electrodes 230 and covers the surfaces of the light emitting structure 220 not in contact with the first electrode 210 or the second electrode 230. A conductive layer 250 is in electrical communication with each of the second electrodes 230 through the openings 200 defined in the nonconductive material 240. The conductive layer 250 can be separated from the light emitting structure 220 and the first electrode 210 by the non-conducting material 240 beyond the periphery of the second electrode 230.

In the device 360 shown in FIGS. 10A and 10B, the plurality of second electrodes 230 can be addressed simultaneously because a single conductive layer 250 is in electrical communication with all the second electrodes. Such a device can be illuminated over a large area without a significant loss of the illumination intensity across the device.

Figure 11A:
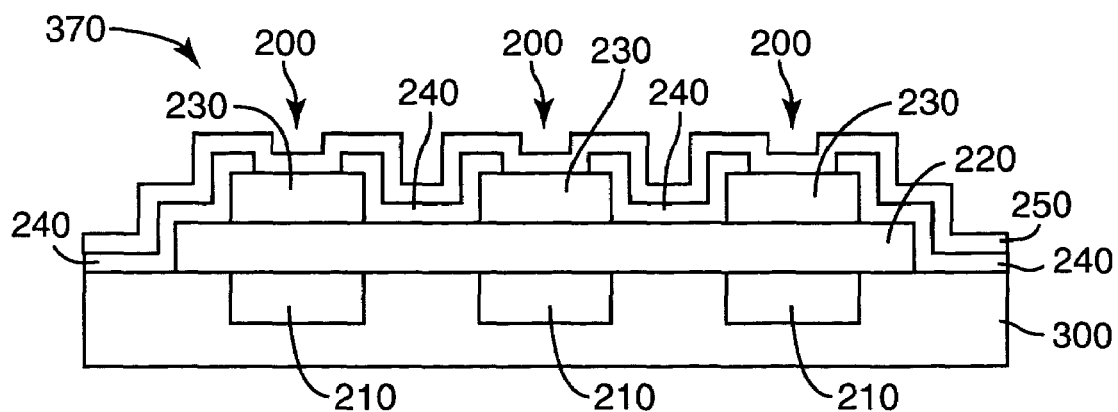
FIG. 11A is a schematic cross-sectional view of one embodiment of an organic electroluminescent device having a plurality of first and second electrodes.
Figure 11B:
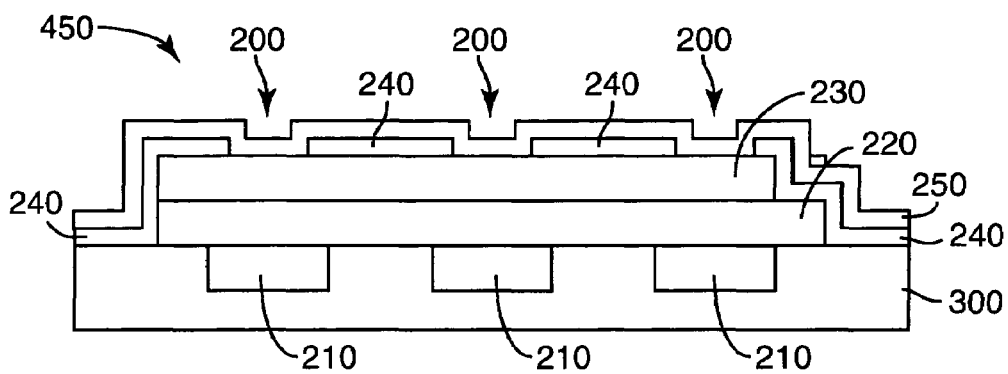
FIG. 11B is a schematic cross-sectional view of one embodiment of an organic electroluminescent device having a plurality of first electrodes and single second electrode.
Figure 12A:
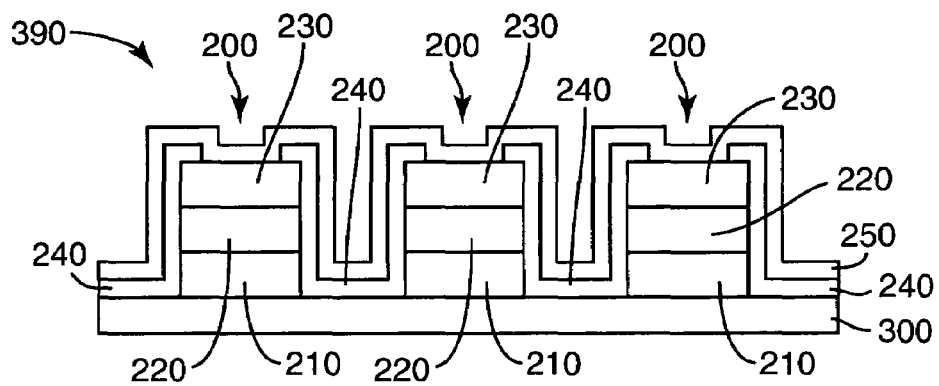
FIG. 12A and 12B are schematic cross-sectional views of other embodiments of organic electroluminescent devices having a plurality of first and second electrodes.
Figure 12B:
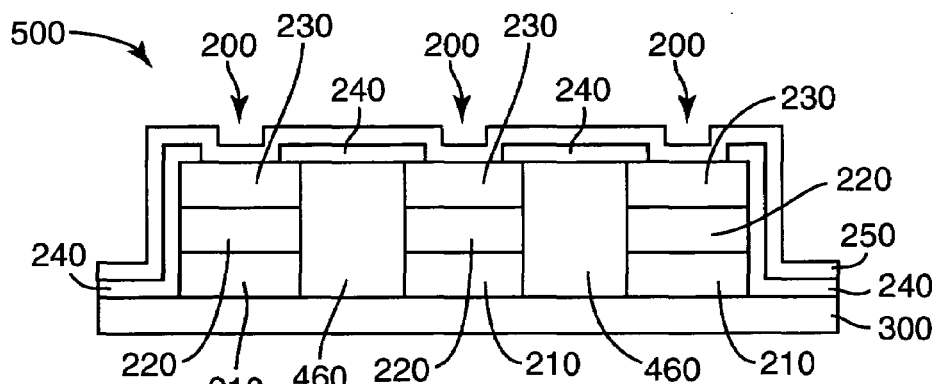

In contrast to device 360 in FIGS. 10A and 10B, a device containing a plurality of first electrodes or a device containing a plurality of first electrodes and a plurality of second electrodes can be addressed in multiple locations. That is, such a device can be used to form a device or display having multiple pixels. FIG. 11A, 11B, 12A, and 12B are schematic cross-sectional views of an organic electroluminescent devices that contain a plurality of first electrodes 210. FIGS. 11A, 12A, and 12B include a plurality of first electrodes 210 and second electrodes 230.

FIG. 11A is a schematic cross-sectional view of device 370 containing a plurality of first electrodes 210, a non-patterned light emitting structure 220, and a plurality of second electrodes 230. FIG. 11B is a schematic cross-sectional view of device 450 containing a plurality of first electrodes 210, a non-patterned light emitting structure 220, and a non-patterned second electrode 230. The first electrode in these devices can be prepared, for example, by disposing a plurality of first electrodes 210 and a plurality of non-conductive materials in a pattern such as parallel stripes or a grid on a substrate 300. Any two dimensional pattern can be used to print the first electrodes 210 on the substrate 300.

In some embodiments, the organic electroluminescent device can be a multiple color display. For example, the OEL device 390 shown in FIGS. 12A and OEL device 500 shown in FIG. 12B can contain a plurality of organic electroluminescent materials patterned between a plurality of first electrodes 210 and a plurality of second electrodes 230. The different organic electroluminescent materials can emit light of different wavelengths. A non-conductive material 460 can separate the plurality of first electrodes and second electrodes from each other. The non-conductive material 460 can be the same material as 240 or can be different. The non-conductive material 460 can be, for example, a black matrix.

Another aspect of the invention provides methods for preparing organic electroluminescent devices. In one embodiment, an electroluminescent structure is formed that includes, but is not limited to, a first electrode, a second electrode, a light emitting structure, a conductive layer, and a non-conductive material. The light emitting structure is disposed between the first and second electrodes. An opening in the non-conductive material is formed and positioned in an area of a surface of the second electrode, such as the surface opposite the light emitting structure. The area of the opening in the non-conductive material is typically about equal to or smaller than the area of the surface of the second electrode over which the opening is positioned. Electrical communication can be established between the conductive layer and the second electrode through the opening in the non-conductive material.

The method can involve encapsulating the second electrode and the light emitting structure. For example, the conductive layer and the non-conductive material can extend beyond the periphery of the second electrode. The non-conductive material can separate the conductive layer from other active components of the OEL device beyond the periphery of the second electrode. A seal can be formed by using the non-conductive material to laminate the conductive layer to the first electrode, the substrate or both beyond the periphery of the second electrode.

As an example, organic electroluminescent devices of the invention can be prepared by depositing a conductive material to form a first electrode that is transparent to the radiation of interest (e.g., the radiation emitted by the light emitting structure). One or more layers of organic electroluminescent materials can be disposed on the first electrode to form a light emitting structure. A second electrode can be disposed on light emitting structure such that the light emitting structure is between the first and second electrodes.

One or more openings can be formed in a non-conductive material such as, for example, an adhesive layer having a release liner on one surface or both surfaces. The opening can be cut through the adhesive layer and at least one of the release liners by, for example, die cutting, kiss cutting, or other methods. One release liner can then be removed and the adhesive attached to either the conductive layer or second electrode(s). The second release liner can then be removed and the conductive layer can be coupled to the second electrode(s) and the remainder of the structure via the adhesive layer.

The openings can be positioned in an area of a surface of the second electrode, such as the surface opposite the light emitting structure. Upon removal of the release liner, the adhesive layer can be bonded to a conducting layer such that the conducting layer is in electrical communication with the second electrode through the opening in the adhesive layer.

The method can be a roll-to-roll process. The electroluminescent structure can be constructed on a first roll. For example, the first electrode can be deposited on a roll of substrate or can be available without a substrate on a roll. The light emitting structure and the second electrode can be disposed on a surface of the first electrode such that the light emitting structure is positioned between the two electrodes. The non-conductive material and the conducting layer can be provided in the form of a second roll and third roll, respectively. At least one openings can be formed in the second roll. The second roll can be laminated between the first and third rolls such that the opening is aligned with a surface of the second electrode and electrical communication is established between the conductive layer and the second electrode through the opening in the non-conductive layer.

The adhesive layer and the conductive layer can both extend beyond the outer periphery of the second electrode. The adhesive layer can function to laminate the conductive layer to the first electrode or the substrate beyond the outer periphery of the second electrode, thereby encapsulating the organic electroluminescent device. The adhesive layer also functions to separate the conducting layer from other active components of the OEL device such as the first electrode beyond the outer periphery of the second electrode. The adhesive layer can also function to seal the device.

The lamination temperature can be sufficient to soften or melt the adhesive layer. In some embodiments, the temperature is typically kept below about 100° C. For example, the lamination temperature can be kept below about 60° C to reduce the likelihood of damage to the device layers such as the light emitting structure.

The organic electroluminescent devices can be an active or passive display or device. A passive display or device typically has the anode and cathode oriented at 90 degree angles from each other, although other orientations are possible.

The organic electroluminescent devices of the invention can be used, for example, for general lighting purposes or as backlights. Constructions of the backlights can include bare or circuitized substrates, anodes, cathodes, hole transport layers, electron transport layers, hole injection layers, electron injection layers, emissive layers, color changing layers, and other layers and other materials suitable for organic electroluminescent devices. Constructions can also include polarizers, diffusers, light guides, lenses, light control films, brightness enhancement films, and the like. Applications include white and single color large area single pixel lamps and multiple colored large area single pixel lamps.

The organic electroluminescent devices of the invention can be used as low resolution displays. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

The organic electroluminescent devices of the invention can be used as high resolution displays. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); and security display applications.

The foregoing describes the invention in terms of embodiments foreseen by the inventor for which an enabling description was available, notwithstanding that insubstantial modifications of the invention, not presently foreseen, may nonetheless represent equivalents thereto.

EXAMPLES

Example 1

Covion PDY132 light emitting polymer (LEP) was used to make a flexible organic light emitting diode (OLED) with a circular emitting area of one inch in diameter.

A UV-curable polymer solution was made containing 80 grams of Ebecryl™ 629 (UCB Chemicals, Smyrna, Ga.), 20 grams of SR399 (Sartomer Company, Exton, Pa.) and 2 grams of Irgacure™ 184 (Ciba Specialty Chemicals, Tarrytown, N.Y.) dissolved in 1000 grams of Methyl Ethyl Ketone. The resulting solution was coated on a 100 micron PET film (HSPE 100 available from Teijin Corp., Japan) using a Yasui Seiki model CAG150 coater fitted with a 110 R knurl at a web speed of 20 ft/min. The coating was dried in-line at 70° C. and cured with an F-600 Fusion D UV lamp operating at 100% power. The resulting polymer coated web was then sequentially coated with 35 nm of ITO, 10 nm of Ag and 35 nm of ITO to obtain a sheet resistance of 15 ohms/square. The ITO/Ag/ITO coating remained unpatterned.

A small piece of the ITO/Ag/ITO coated PET was cut from the roll to be used for device fabrication. The piece was cleaned in an ultrasonic cleaning system. The ITO surface was then plasma treated for 2 minutes at a base pressure of 0.030 torr, oxygen flow rate of 500 sccm and Rf power of 400 watts, in a Plasma Science plasma treater (Model PS 500 available from AST Inc. of Billerica, Mass.).

PEDOT 8000 (poly(3,4-ethylenedioxythiophene)/poly (styrenesulfonate) also known as PEDT/PSS, available from H. C. Starck, Leverkusen, Germany) was diluted with IPA and spin coated onto the ITO surface using a vacuum spin coating chuck. Spinning at 3000 rpm for 30 seconds resulted in a PEDOT 8000 thickness of 90–100 nm. The PEDOT was dried in a 65° C. nitrogen purge oven for 10 minutes. The pieces were transferred into a nitrogen atmosphere glove box and are placed onto a 100° C. hot plate for 2 minutes for further PEDOT 8000 drying. The PEDOT 8000 was a conductive polymer and functioned as a buffer layer.

Covion PDY132 LEP (0.5 wt % in toluene, available from Covion Organic Semiconductors GmbH, Frankfurt, Germany) was spin coated onto the PEDOT 8000 surface using a vacuum chuck. Spinning at 2500 rpm for 30 seconds resulted in a 75 nm film.

A small portion of the ITO surface was cleaned of LEP and PEDOT for contacting the ITO as the anode. A 50×50 mm square was cut from the piece.

Calcium was then deposited 400 Å thick via thermal evaporation onto the LEP surface through a mask with a one inch diameter opening. Silver was then vacuum deposited to 3000 Å thick on top of the calcium using the same method and mask.

The encapsulation materials were prepared by cutting a 0.5 inch diameter hole out of the middle of a 35 mm×35 mm piece of 3M™ Thermo-bond 845. The 3M™ Thermo-bond was laminated at 300° F. (148° C.) to a 35 mm×35 mm piece of 4 mil (0.1 mm) copper foil. The piece of 3M™ Thermo-bond /copper was placed on top of a 300° F. (148° C.) hotplate with the copper facing down and 3M™ Thermo-bond facing up with the liner removed. The 3M™ Thermo-bond /copper was allowed to reach temperature for 5–10 minutes.

The flexible OLED device was placed in contact with, and allowed to stick to, the 3M™ Thermo-bond; the construction was then removed from the hot plate, placed on the floor of the glove box and the two pieces were laminated together with a hand roller. The resulting encapsulated OLED device emitted light when the copper foil and ITO coating were connected to the leads of a battery.

Example 2

Several orange-red emitting OLED devices were prepared on 22 mm square (1.0 mm thick) ITO coated glass (15 ohm/square, Colorado Concept Coatings LLC, Longmont, Colo.). The ITO coating was not patterned and thus covered the entire surface of the glass substrate. The ITO coated substrates were cleaned by rubbing with a methanol soaked lint-free cloth (Vectra Alpha 10, Texwipe Co., LLC, Upper Saddle River, N.J.) followed by a 4 minute oxygen plasma treatment (full power and 5 psi oxygen, Plasma-Preen II-973, Plasmatic Systems, Inc., North Brunswick, N.J.).

An aqueous solution of (poly(3,4-ethylenediox-ythiophene)/poly(styrenesulfonate) (1% solids, Baytron P 4083, Bayer, Leverkuesen, Germany) was spin coated onto the cleaned, etched substrates to give a 50 nm film. The Baytron P 4083 was a conductive polymer and functioned as a buffer layer. The Baytron P 4083 and ITO coated substrates were dried for 15 minutes on a 110° C. hot plate under a flow of nitrogen.

The coated substrates were transferred to a bell jar evaporation chamber and evacuated to about $10^{-6}$ torr. Layers of 300 Å thick N,N'-bis(3-naphthalen-2-yl)-N,N'-bis(phenyl)benzidine (NPD, from H. W. Sands Corp., Jupiter, Fla.); 300 Å thick 9,10-bis(2-naphthyl)anthracene (ADN from Eastman Kodak Co., Rochester, N.Y.) doped with 1% 4-(dicya-nomethylene)-2-t-butyl-6-(1,1,7,7-tetramethyljulolidyl-9-enyl)-4H-pyran (DCJTB, from Eastman Kodak Co., Rochester, N.Y.); and 200 Å thick tris(8-hydroxyquinolino-lato)aluminum (AlQ, from H. W. Sands Corp., Jupiter, Fla.) were thermally deposited in sequence through a shadow mask containing a 19.5 mm square opening. The NPD functioned as a hole transport layer, the ADN and AlQ functioned as an electron transport layers, and DCJTB was a fluorescent dye used as a dopant to alter the color of the light emission.

The organic coated substrates were transferred to glove box that contained a thin film evaporation chamber (Edwards 500, BOC Edwards, England) for the thermal deposition of cathodes. Layers of 100 Å thick AlQ (from H. W. Sands Corp., Jupiter, Fla.), 7 Å thick LiF (from Alfa-Aesar Co., Ward Hill, Mass.), 200 Å thick Al (from Alfa-Aesar Co., Ward Hill, Mass.), and 1,000 Å thick Ag (from Alfa-Aesar Co., Ward Hill, Mass.) were sequentially deposited at about $10^{-7}$ torr onto the organic coated substrates through a metal shadow mask that contained a 1 cm² circular opening disposed such that the cathode was in the approximate center of the substrate.

A piece of 3M™ Thermo-Bond 845-EG thermal laminating film on release liner (2.5 mil adhesive thickness) approximately 100×50 mm was cut from a roll of the material. The release liner was marked to form a 2×8 grid of 25 mm squares. A 6 mm circular hole was cut in the center of each 25 mm square using a hand-held pliers-type paper punch. This was placed onto an approximately 125×75 mm piece of 0.05 mm thick Al foil (McMaster-Carr Supply Co., Chicago, Ill.) with the adhesive side contacting the foil. This assembly was in turn placed on an aluminum plate (3×9× 0.025 inches, The Q-panel Company, Cleveland, Ohio) with the release liner side contacting the aluminum plate. This was then feed three times in succession through a 2-roll thermal laminator (TDE Systems model HL-406, Kmart Corp., Troy, Mich.) operating at approximately 102° C. to laminate the adhesive film to the Al foil and deform the foil into the 6 mm hole in the adhesive.

The laminated Al foil was removed from the aluminum carrier plate, cut with scissors into 25 mm squares, and brought into the glove box containing the orange-red emitting OLED devices. One of the 25 mm squares was trimmed with scissors to about 16 mm square such that the 6 mm hole in the adhesive layer remained at the approximate center of the film. The release liner was then removed and the encapsulating film was placed onto the cathode side of one of the 22 mm square OLED devices such that the adhesive layer of the encapsulation film was in contact with the OLED device and the 6 mm hole through the adhesive layer was approximately centered over the cathode of the device. The cathode and its peripheral area were completely covered by the encapsulating film. The encapsulating film was thermally laminated to the OLED device in the inert nitrogen atmosphere of the glove box by passing the assembly through a 2 roll thermal laminator (Bestech model 2962, Rose Art Industries, Livingston, N.J.) that operated at about 100° C.

Upon cooling, anode connections to the encapsulated OLED were made by contacting the IFO of the substrate anywhere on the periphery of the Al encapsulating film and cathode connections were made by contacting any portion of the Al encapsulation film. When current was applied, orange-red light was emitted from the device. At 6 mA/cm² the current-voltage-luminance characteristics of the laminated device were essentially unchanged from the device characteristics prior to the thermal lamination encapsulation procedure.

We claim:

1. A method of preparing an organic electroluminescent device comprising:

forming an electroluminescent structure comprising a first electrode, a second electrode, and a light emitting structure, wherein the light emitting structure is disposed between the first and second electrodes;

forming an opening in a non-conductive material, said non-conductive material comprising a thermoplastic polymeric material, wherein the opening has an area that is smaller than an area of the second electrode opposite the light emitting structure;

aligning the opening in the non-conductive material with a surface of the second electrode, wherein the second electrode is in direct contact with the non-conductive material in any portion of the second electrode extending beyond the opening; and establishing an electrical communication between a conductive layer and the second electrode through the opening in the non-conductive material, wherein both the conductive layer and the non-conductive material extend beyond an outer periphery of the second electrode.

2. The method of claim 1, further comprising encapsulating the second electrode and the light emitting structure.

3. The method of claim 1, further comprising encapsulating the second electrode and the light emitting structure with the non-conductive material and with the conductive layer, wherein the non-conductive layer separates the conductive layer from the first electrode beyond the periphery of the second electrode.

4. The method of claim 1, wherein the method is a roll-to-roll process.

5. The method of claim 1, wherein the non-conductive material comprises an adhesive layer.

6. The method of claim 1, wherein the non-conductive material comprises an adhesive layer and forming the opening in the non-conductive material comprises forming a hole in the adhesive layer that is further attached to a release liner; and removing the release liner; and attaching the adhesive layer to the conductive layer.

7. The method of claim 1, wherein farming the opening comprises cutting a hole in a layer of the non-conductive material.

8. The method of claim 1, wherein the electroluminescent structure is formed on a flexible substrate.

9. The method of claim 1, wherein aligning the opening is performed after forming the electroluminescent structure.

10. The method of clam 1, wherein the conductive layer contacts all portions of a surface of the non-conductive material opposite the second electrode.

11. A method of forming an electroluminescent device comprising:

forming a first electrode in the form of a first roll;

adding a light emitting structure and a second electrode to the first roll, wherein the light emitting structure is disposed between the first and second electrode;

providing a non-conductive material comprising a thermoplastic polymeric material in the form of a second roll and a conductive layer in the form of a third roll;

forming an opening in the second roll, wherein an area of the opening is smaller than an area of the second electrode opposite the light emitting structure;

laminating the second roll between the first and third rolls, wherein the opening is aligned with a surface of the second electrode and electrical communication is established between the conductive layer and the second electrode through the opening in the non-conductive layer, wherein the second electrode is in direct contact with the non-conductive material in any portion of the second electrode extending beyond the opening, and wherein both the conflictive layer and the non-conductive material extend beyond an outer periphery of the second electrode.

12. The method of claim 11, wherein the non-conductive material is an adhesive layer.

13. The method of claim 11, wherein forming an opening in the second roll comprises cutting a hole in the non-conductive material.

14. The method of claim 11, wherein the non-conductive material comprise an adhesive layer, the second roll comprising the adhesive layer and a release liner attached to the adhesive layer, wherein laminating the first second roll comprises removing the release liner attached to the adhesive layer.

15. The method of claim 11, wherein the third roll comprises a deformable metal film.

16. The method of clam 11, wherein forming the first electrode comprises disposing the first electrode on a flexible substrate.

17. The method of claim 11, wherein laminating encapsulates the electroluminescent structure.

18. The method of claim 11, wherein laminating is at a temperature below 100° C.

19. The method of claim 11, wherein laminating comprises attaching the conductive layer to all portions of the non-conductive layer opposite the second electrode that extend beyond the periphery of the second electrode.

* * * * *

UNITED STATES PATENT AND TRADEMARK OFFICE
CERTIFICATE OF CORRECTION

PATENT NO. : 7,156,942 B2  Page 1 of 1
APPLICATION NO. : 11/179401
DATED : January 2, 2007
INVENTOR(S) : Fred B. McCormick It is certified that error appears in the above-identified patent and that said Letters Patent is hereby corrected as shown below:

Col. 2
Line 29, after "substrate" insert -- . --.
Line 46, before "12A and 12B" delete "FIG." and insert -- FIGS. --, therefor.

Col. 7
Line 1, delete "(FFO)." and insert -- (FTO). --, therefor.

Col. 9
Lines 8-9, delete "Gravulevicius," and insert -- Grazulevicius, --, therefor.
Line 25, delete "Gravulevicius," and insert -- Grazulevicius, --, therefor.

Col. 10
Line 26, delete "DeSiMax$^{TM}$" and insert -- DesiMax$^{TM}$ --, therefor.

Col. 15
Line 45, before "11A, 11B" delete "FIG." and insert -- FIGS. --, therefor.
Line 64, before "12A" delete "FIGS." and insert -- FIG. --, therefor.

Col. 20
Line 38, delete "IFO" and insert -- ITO --, therefor.

Col. 21
Line 23, in claim 7, delete "farming" and insert -- forming --, therefor.
Line 30, in claim 10, delete "claim" and insert -- claim --, therefor.

Col. 22
Line 12, in claim 11, delete "conflictive" and insert -- conductive --, therefor.

Signed and Sealed this

Eighth Day of May, 2007

JON W. DUDAS
*Director of the United States Patent and Trademark Office*